(12) United States Patent
Dow et al.

(10) Patent No.: US 6,599,561 B2
(45) Date of Patent: Jul. 29, 2003

(54) METHOD FOR MANUFACTURING A PRINTED CIRCUIT BOARD SUBSTRATE

(75) Inventors: Richard Dow, Philadelphia, PA (US); Tim W. Ellis, Doylestown, PA (US); David T. Beatson, Kennett Square, PA (US); Michael Hillebrand, Jermyn, PA (US)

(73) Assignee: Kulicke & Soffa Investments, Inc., Wilmington, DE (US)

( * ) Notice: Subject to any disclaimer, the term of this patent is extended or adjusted under 35 U.S.C. 154(b) by 0 days.

(21) Appl. No.: 10/010,675

(22) Filed: Nov. 30, 2001

(65) Prior Publication Data

US 2003/0104182 A1 Jun. 5, 2003

(51) Int. Cl.[7] .................................................. B05D 5/12
(52) U.S. Cl. .................... 427/96; 427/289; 427/434.6; 29/825; 29/850; 29/880
(58) Field of Search .......................... 29/825, 850, 880; 174/250, 251; 427/96, 434.6, 289

(56) References Cited

U.S. PATENT DOCUMENTS

| | | | | |
|---|---|---|---|---|
| 3,631,298 A | * | 12/1971 | Davis | 361/809 |
| 3,711,627 A | * | 1/1973 | Maringulov | 174/68.5 |
| 4,513,055 A | * | 4/1985 | Leibowitz | 428/245 |
| 5,206,078 A | * | 4/1993 | Inoguchi et al. | 428/225 |
| 5,524,679 A | * | 6/1996 | Wiener | 139/420 R |

* cited by examiner

*Primary Examiner*—Brian K. Talbot
(74) *Attorney, Agent, or Firm*—Townsend and Townsend and Crew LLP

(57) ABSTRACT

An inexpensive and high throughput process for manufacturing a printed circuit board (PCB) substrate includes first weaving a plurality of electrically non-conductive strands (e.g., fiberglass yarns) and at least one electrically conductive strand (e.g., a copper wire) to form a woven fabric with an upper surface and a lower surface. Next, the woven fabric is impregnated with a resin material to form an impregnated fabric, which is then cured to form a cured fabric. The upper and lower surfaces of the cured fabric are subsequently planed. The planing step segments the electrically conductive strand(s) and forms a PCB substrate that includes a planarized cured fabric with upper and lower planed surfaces and a plurality of electrically conductive strand segments extending from the upper planed surface to the lower planed surface. Since each of the electrically conductive strand segments extends from the upper planed surface to the lower planed surface, the segments function as electrically conductive vias of the PCB substrate. Also, a PCB substrate that includes a planarized woven fabric with a cured resin material impregnated therein. The planarized woven fabric includes planed upper and lower surfaces and a plurality of integrally formed electrically conductive strand segments (e.g., copper wire segments) extending from the upper planed surface to the lower planed surface. Since the electrically conductive strand segments were formed integrally with the remainder of the planarized woven fabric, PCB substrates are of high mechanical stability.

32 Claims, 4 Drawing Sheets

METHOD FOR MANUFACTURING A PRINTED CIRCUIT BOARD SUBSTRATE

BACKGROUND OF THE INVENTION

1. Field of the Invention

The present invention relates, in general, to semiconductor device packaging and, in particular, to printed circuit board (PCB) substrates and methods for their manufacture.

2. Description of the Related Art

Printed Circuit Board (PCB) substrates serve as a base for the mechanical support and electrical interconnection of semiconductor devices (e.g., integrated circuits). FIG. 1 is a simplified cross-sectional diagram of a portion of a conventional PCB substrate 10. Conventional PCB substrate 10 includes a sheet-like base 12 formed of an electrically non-conductive composite material (e.g., a glass material with epoxy resin). Sheet-like base 12 has an upper surface 14 and a lower surface 16. Conventional PCB substrate 10 also includes a plurality of electrically conductive vias 18 (only one of which is shown in FIG. 1) that extend from upper surface 14 to lower surface 16.

Conventional PCB substrates are typically manufactured by initially forming a sheet-like base of non-conductive material. The sheet-like base can be formed, for example, by weaving glass fibers into a sheet of cloth. The sheet of cloth is then dipped in resin and thermally cured to form the sheet-like base. Thereafter, via holes are mechanically drilled through the sheet-like base, plated and filled with an electrically conductive material (e.g., copper) to form electrically conductive vias. The mechanical drilling, plating and filling steps of such a conventional process are expensive, have a low throughput and result in a low yield. This is especially so when a PCB substrate with a large number of electrically conductive vias and/or electrically conductive vias of small diameter is being manufactured. Furthermore, the act of mechanically drilling through the sheet-like base, by itself, can inadvertently decrease the mechanical stability of the PCB substrate.

Still needed in the field, therefore, is an inexpensive and high throughput method for manufacturing a PCB substrate. In addition, the method should result in a high PCB substrate yield and a PCB substrate of high mechanical stability.

BRIEF SUMMARY OF THE INVENTION

The present invention provides an inexpensive and high throughput process for manufacturing a PCB substrate. In addition, the process has a high PCB substrate yield and produces a PCB substrate of high mechanical stability.

A process according to one exemplary embodiment of the present invention includes first weaving a plurality of electrically non-conductive strands (e.g., fiberglass yarns) and at least one electrically conductive strand (e.g., a copper wire) to form a woven fabric. Upper and lower surfaces of the woven fabric thus formed are exposed.

Next, the woven fabric is impregnated with a resin material to form an impregnated fabric and, thereafter, the impregnated fabric is cured to form a cured fabric. The upper and lower surfaces of the cured fabric are then planed. The planing of these surfaces segments the at least one electrically conductive strand and forms a PCB substrate. The PCB substrate formed by the planing step includes a planarized cured fabric with an upper planed surface, a lower planed surface and a plurality of electrically conductive strand segments extending from the upper planed surface to the lower planed surface. Since each of the electrically conductive strand segments extends from the upper planed surface to the lower planed surface, the electrically conductive strand segments are configured to function as electrically conductive vias in the PCB substrate.

Weaving is a reliable, inexpensive and high throughput process technology in comparison to the mechanical drilling, plating and filling technologies used in conventional PCB substrate manufacturing. Therefore, processes according to the present invention provide for the inexpensive, high throughput and high yield manufacturing of PCB substrates.

The present invention also provides a PCB substrate having a planarized woven fabric with a cured resin material impregnated therein. The planarized woven fabric includes an upper planed surface, a lower planed surface and a plurality of integrally formed electrically conductive strand segments (e.g., copper wire segments) extending from the upper planed surface to the lower planed surface. Since the electrically conductive strand segments were formed integrally with the remainder of the planarized woven fabric, PCB substrates according to the present invention are of high mechanical stability.

A better understanding of the features and advantages of the present invention will be obtained by reference to the following detailed description that sets forth illustrative embodiments, in which the principles of the invention are utilized, and the accompanying drawings.

DETAILED DESCRIPTION OF THE INVENTION

To be consistent throughout the present specification and for clear understanding of the present invention, the following definitions are hereby provided for terms used therein:

The term "impregnating" refers to the act of filling throughout, saturating or permeating an object (e.g., a woven fabric).

The term "planing" refers to removing the surface(s) of an object (e.g., a cured fabric).

Figure 1:
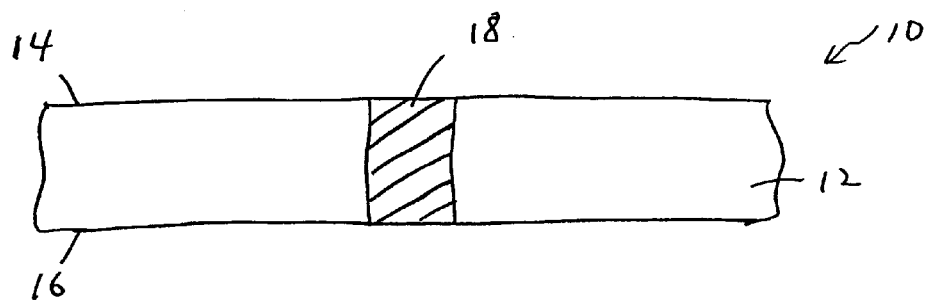
FIG. 1 is a simplified cross-sectional diagram of a portion of a conventional PCB substrate.
Figure 2:
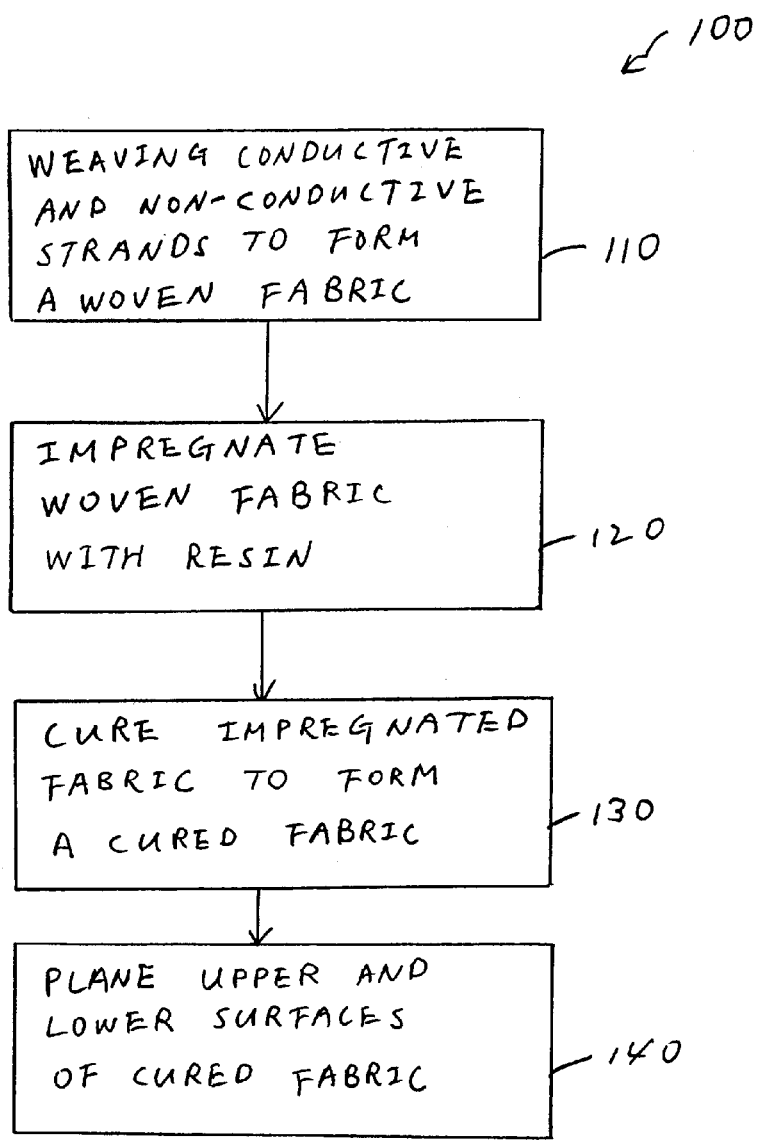
FIG. 2 is a flow chart illustrating a sequence of steps in a process according to one exemplary embodiment of the present invention.

FIG. 2 is a flow chart illustrating a sequence of steps in a process 100 for manufacturing a PCB substrate in accordance with an exemplary embodiment of the present invention. Process 100 first includes, at step 110, weaving a plurality of electrically non-conductive strands and at least one electrically conductive strand to form a woven fabric.

The resultant woven fabric will have its upper and lower surfaces exposed. Weaving step 110 can form the woven fabric using any suitable weaving technique including, for example, a single layer or a multi-layer based weaving technique, Dobby or a Jacquard-based weaving technique. The use of a Jacquard-based weaving technique enables the formation of woven fabrics wherein the electrically non-conductive strands and electrically conductive strand(s) are selectively arranged in either of an irregular woven pattern or a regular woven pattern. Weaving step 110 can be conducted using conventional weaving equipment known to one skilled in the art.

The electrically non-conductive strands employed in processes according to the present invention can be any suitable electrically non-conductive strands including fibers, filaments or yarns formed of glass (e.g., fiberglass, S-glass or E-glass), polyester or other polymers, Teflon or Kevlar. Exemplary commercial electrically non-conductive strands include Type 1064 Multi-End Roving and Hybon 2022 Roving available from PPG Industries.

If a glass strand is employed, it can be optionally treated with silane to improve its adhesive properties to the impregnating resin. One skilled in the art will recognize that the electrical characteristics of the electrically non-conductive strand are a factor in determining the dielectric constant of the PCB substrate.

The thickness of the electrically nonconductive strand is dependent on the weaving technique employed and the thickness of the PCB substrate being manufactured. A typical thickness, where E-glass-based electrically non-conductive fiber are employed, is in the range of 1 microns to 20 microns.

The electrically conductive strand(s) employed in step 110 can be any suitable conductive strand including, but not limited to, a copper wire, gold wire, aluminum wire, an electrically conductive polymer wire or a combination thereof. The diameter of the electrically conductive wire depends on the thickness of the PCB substrate being manufactured and the desired density of electrically conductive vias disposed therein. A typical diameter, however, is in the range of 15 microns to 200 microns.

The electrically conductive strands can either (i) replace a strand that would normally be included in a conventional woven fabric (e.g., a strand that is normally used in a plain weave) or (ii) be implemented as an additional strand beyond those normally included in the pattern of the woven fabric.

The thickness of the woven fabric formed in step 110 is predetermined based on the required PCB substrate thickness. A typical thickness of the woven fabric is, however, in the range of 0.5 mm to 50 mm.

Figure 3A:
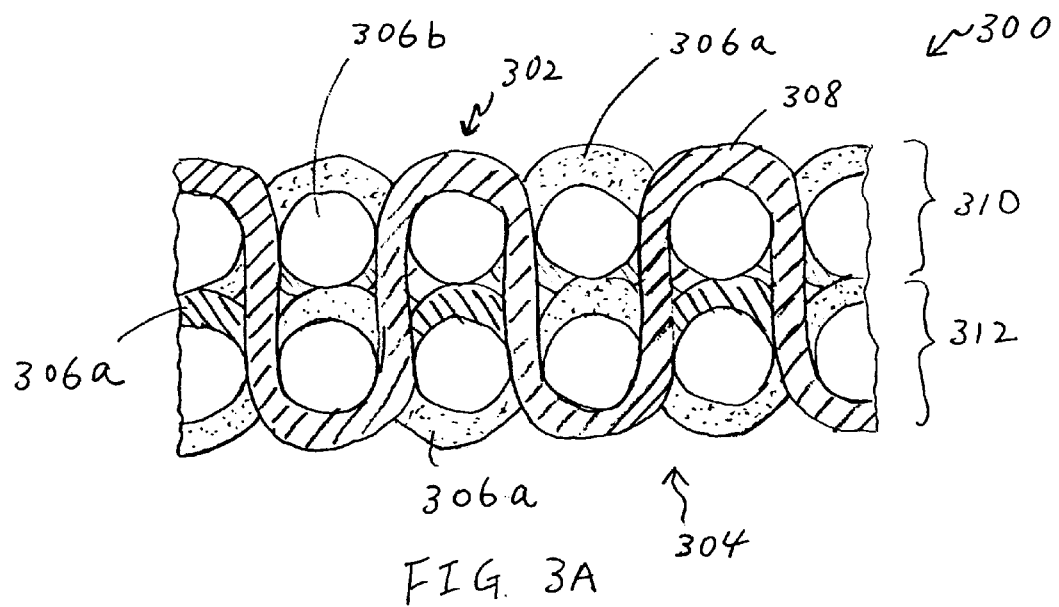
FIGS. 3A and 3B are simplified side and top view representations, respectively, of a two-layer woven fabric produced by a weaving step of a process according to one exemplary embodiment of the present invention.
Figure 3B:
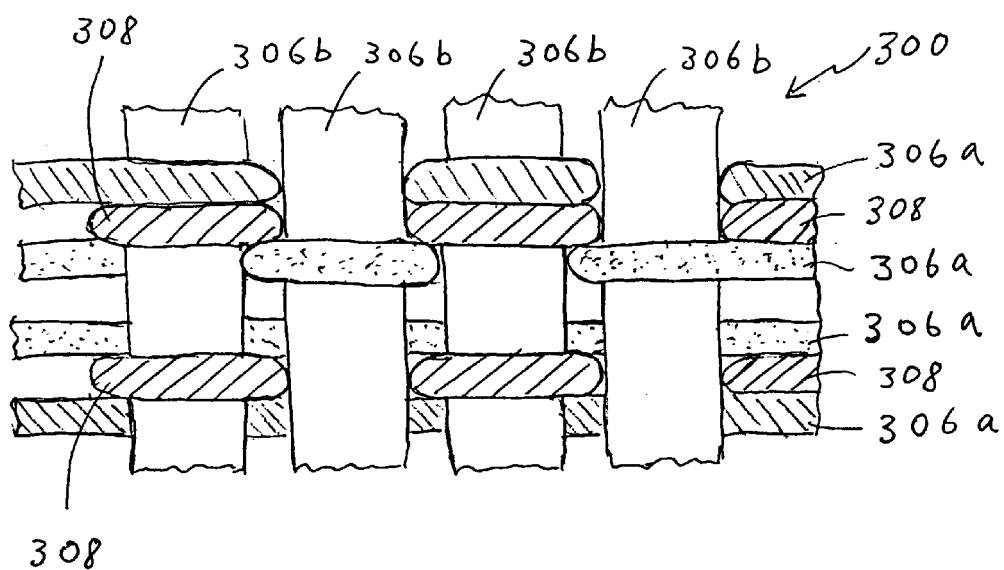

FIGS. 3A and 3B are simplified representations of an exemplary woven fabric 300, with an upper surface 302 and lower surface 304 formed by weaving a plurality of electrically non-conductive strands (shown as 306a and 306b) and electrically conductive strands 308 in accordance with step 110 of FIG. 2. In the embodiment of FIGS. 3A and 3B, the electrically conductive strand is woven such that it extends from upper surface 302 of woven fabric 300 to the lower surface 304 of woven fabric 300. In addition, the weaving of electrically conductive strand 308 results in "loops" (i.e., "U" shaped segments) of electrically conductive strand 308 at the upper and lower surfaces of woven fabric 300.

In the embodiment of FIGS. 3A and 3B, woven fabric 300 is a double-layer woven fabric that includes top layer 310 and bottom layer 312. Top layer 310 and bottom layer 312 are essentially woven together by electrically conductive strand 308, which passes back and forth between top layer 310 and bottom layer 312.

The plurality of electrically non-conductive strands includes "fill" strands 306a disposed in the off-machine direction and warp strands 306b disposed in the machine direction. The fill strands and warp strands are characterized as "crimped" since they are bent at the points where they cross one another.

If desired, the plurality of electrically non-conductive strands can also include "uncrimped" strands (not shown in the embodiment of FIGS. 3A and 3B) disposed in the machine direction between top layer 310 and bottom layer 312 and/or uncrimped fill strands. Uncrimped strands disposed in the machine direction can provide mechanical reinforcement for the woven fabric and final PCB substrate.

By employing multiple layers (e.g., top layer 310 and bottom layer 312), electrically conductive strands 308 are forced into a vertical position as they pass from the top layer to the bottom layer. As will be evident from the discussion below, such a vertical position results, after planing, in an electrically conductive strand segment(s) that is also positioned vertically. Such a vertically positioned electrically conductive strand segment is, therefore, configured to function as a vertically positioned electrically conductive via.

Although FIGS. 3A and 3B illustrate a weave that results in a woven fabric with a woven pattern that follows a square grid array, processes according to the present invention can employ any suitable weaving technique known to one skilled in the art and can result in a woven fabric with regular or irregular woven pattern. For example, a Jacquard weaving technique can be employed to form a woven fabric with regular or irregular woven patterns or a multi-layer woven fabric can be formed in the weaving step. In addition, the diameter and/or type of each of the electrically non-conductive strands and electrically conductive strands can be equal and constant throughout the woven fabric or can vary.

Next, the woven fabric is impregnated with a resin material to form an impregnated fabric, as shown at step 120. The resin material can be any suitable resin material known to one skilled in the art including, for example, epoxy-based resins, bis-mali-imide based resins, Per-Fluoroalkane resins and polyimide resins. Impregnation of the woven fabric with the resin material can be accomplished using conventional techniques.

Next, at step 130 the impregnated fabric is cured to form a cured fabric. The curing can be accomplished, for example, using conventional thermal and/or ultraviolet curing techniques. Although curing process parameters are dependent on the resin material used to impregnate the woven fabric, curing step 130 is typically conducted in a nitrogen or air ambient, at a temperature in the range of 125° C. to 200° C., and for a time period in the range of 15 minutes to 2 hours.

After curing of the impregnated fabric, the upper and lower surfaces of the cured fabric are planed, as shown at step 140.

Figure 4A:
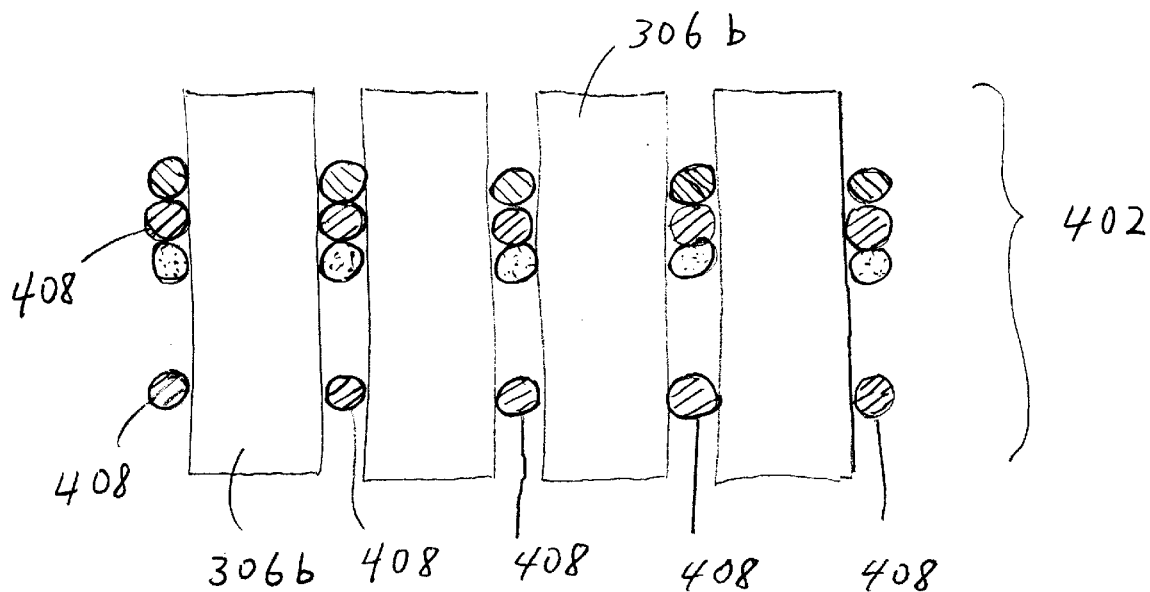
FIGS. 4A and 4B are side and top view representations, respectively, of the two-layer woven fabric depicted in FIGS. 3A and 3B following a planing step of a process according to one exemplary embodiment of the present invention.
Figure 4B:
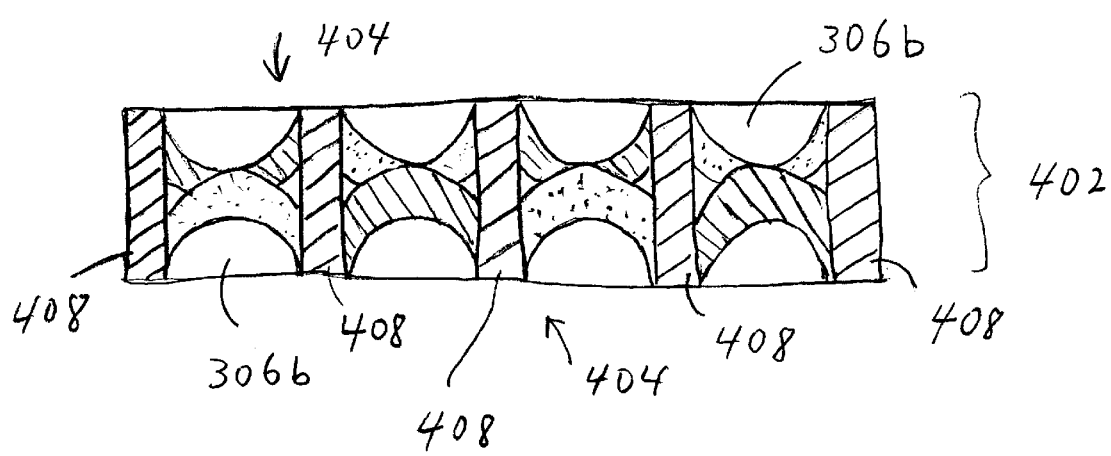

Referring to FIGS. 4A and 4B, this planing step serves to segment the at least one conductive strand and form a PCB substrate 400 that includes a planarized cured fabric 402 with an upper planed surface 404, a lower planed surface 406 and a plurality of conductive strand segments 408 created from the at least one conductive strand. Each of the conductive strand segments 408 extends from the upper planed surface to the lower planed surface and serves as an electrically conductive via of the PCB substrate. In other words, the planing step removes each of the "reentrant loops" of electrically conductive strand 308 at the upper and lower surfaces of woven fabric 300, leaving a plurality of electrically conductive strand segments (vias).

The planing step can be accomplished using grinding techniques, lapping techniques and/or milling techniques (often referred to as "scalping") known to one skilled in the art. The planing step can remove, for example, 1.0 mm to 0.5 mm from each of the upper and lower surfaces of the cured fabric.

Figure 5:
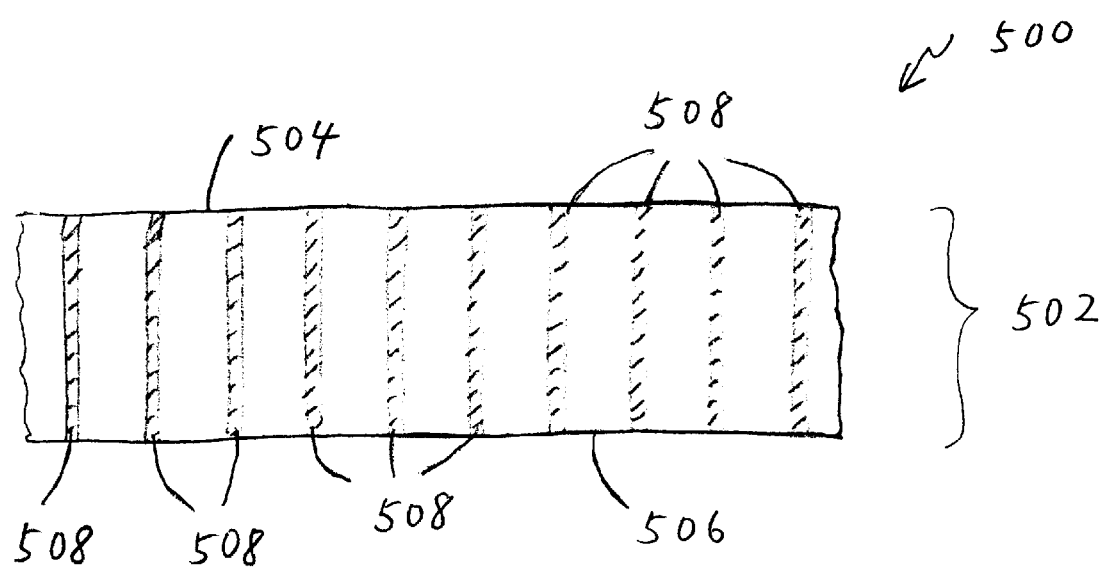
FIG. 5 is a cross-sectional side view of PCB substrate according to one exemplary embodiment of the present invention.

FIG. 5 is a cross-sectional side view of PCB substrate 500 according to the present invention. PCB substrate 500 includes a planarized woven fabric 502 with an upper planed surface 504 and a lower planed surface 506. Planarized woven fabric 502 also includes a plurality of integrally formed electrically conductive strand segments 508 (e.g., copper wire segments, configured to function as electrically conductive vias) extending from upper planed surface 504 to the lower planed surface 506. Planarized woven fabric 502 is impregnated with a cured resin material (not shown).

Exemplary but non-limiting dimensions for PCB substrate 500 are a thickness of 0.8 mm, an electrically conductive strand segment pitch of 1.0 mm and an electrically conductive strand segment diameter of 70 microns.

In the embodiment of FIG. 5, the plurality of electrically conductive strand segments are disposed in the planarized woven fabric in a regular pattern. However, the plurality of electrically conductive strand segments can also be disposed in an irregular pattern.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A method for manufacturing a printed circuit board (PCB) substrate comprising:
   weaving a plurality of electrically non-conductive strands and at least one electrically conductive strand to form a woven fabric with an upper surface and a lower surface, wherein the at least one electrically conductive strand is woven such that it extends from the upper surface to the lower surface;
   impregnating the woven fabric with a resin material to form an impregnated fabric;
   curing the impregnated fabric to form a cured composite material; and
   planing the upper and lower surface of the cured composite material, thereby segmenting the at least one electrically conductive strand and forming a PCB substrate that includes a planarized cured composite material with an upper planed surface, a lower planed surface and a plurality of electrically conductive strand segmentsextending from the upper planed surface to the lower planed surface.

2. The method of claim 1 wherein the weaving step is conducted such that the at least one electrically conductive strand extends from the upper surface to the lower surface of the woven fabric.

3. The method of claim 1 further comprising, during the weaving step, weaving a plurality of electrically conductive strands.

4. The method of claim 1 further comprising, during the weaving step; weaving a plurality of electrically non-conductive strands with fill strands and warp strands.

5. The method of claim 1 further comprising, during the weaving step, weaving a plurality of electrically non-conductive strands with crimped fill strands, crimped warp strands and uncrimped machine-direction strands.

6. The method of claim 1 further comprising, during the weaving step, weaving a plurality of electrically non-conductive strands with uncrimped fill strands, uncrimped warp strands and uncrimped machine-direction strands.

7. The method of claim 1 further comprising, during the weaving step, weaving a plurality of electrically non-conductive strands with any combination of crimped fill strands, uncrimped fill strands, crimped warp strands, uncrimped warp strands, crimped machine-direction strands and uncrimped machine-direction strands.

8. The method of claim 1 wherein the plurality of electrically non conductive strands are electrically non-conductive yarns.

9. The method of claim 8 wherein the plurality of electrically non conductive yarns are fiberglass yarns.

10. The method of claim 1 wherein the at least one electrically conductive strand is at least one copper wire.

11. The method of claim 1 wherein the weaving step employs a double-layer weaving based technique.

12. The method of claim 1 wherein the weaving step employs a multi-layer weaving based technique.

13. The method of claim 1 wherein the weaving step employs a Jacquard based weaving technique or Dobby based weaving technique.

14. The method of claim 1 wherein the weaving step employs a Dobby based weaving technique.

15. The method of claim 1 wherein the electrically conductive strands are sufficiently thick to act as functional vias between the upper planed surface and lower planed surface of the PCB substrate.

16. The method of claim 1 wherein the weaving step weaves the electrically conductive strand in a pattern such that that planing step forms a plurality of electrically conductive strand segments disposed in a regular pattern.

17. The method of claim 1 wherein the weaving step weaves the electrically conductive strand in a pattern such that the planing step forms a plurality of electrically conductive strand segments disposed in an irregular pattern.

18. The method of claim 1 wherein the weaving step creates a woven fabric such that the at least one electrically conductive strand includes a plurality of upper loops at the upper surface and a plurality of lower loops at the lower surface, and
   wherein the planing step segments the at least one electrically conductive strand by removing the plurality of upper loops and the plurality of lower loops.

19. The method of claim 1 wherein the planing step removes between 0.5 to 1.0 mm from each of the upper and lower surfaces of the cured composite material.

20. The method of claim 1 wherein the weaving step includes weaving electrically non-conductive fill strands in an off-machine direction and weaving electrically non-conductive warp strands in a machine direction.

21. The method of claim 20 wherein the weaving step further includes weaving uncrimped strands in the machine and/or off-machine directions.

22. The method of claim 1 wherein the weaving step includes weaving a plurality of layers of fabric together by an electrically conductive strand.

23. The method of claim 1 wherein the electrically non-conductive strands have a thickness between 1 and 20 microns.

24. The method of claim 23 wherein the electrically conductive strands have a thickness between 15 and 200 microns.

25. A method for manufacturing a printed circuit board (PCB) substrate comprising:

weaving a plurality of electrically non-conductive strands and at least one electrically conductive strand to form a woven fabric with an upper surface and a lower surface, wherein the at least one electrically conductive strand is woven such that it forms loops exposed at the upper and lower surfaces of the woven fabric;

thereafter, impregnating the woven fabric with a resin material to form an impregnated fabric;

thereafter, curing the impregnated fabric to form a cured composite material; and thereafter, cutting the loops of the at least one electrically conductive strand on the upper and lower surfaces of the cured composite material to create a plurality of electrically conductive strand segments that extend from the upper surface to the lower surface of the cured composite material.

26. The method of claim 25 wherein the cutting is performed by a lapping technique, a milling technique and/or a grinding technique.

27. The method of claim 26 wherein the cutting step removes between 0.5 to 1.0 mm from each of the upper and lower surfaces of the cured composite material.

28. The method of claim 27 wherein the electrically non-conductive strands have a thickness between 1 and 20 microns.

29. The method of claim 28 wherein the electrically conductive strands have a thickness between 15 and 200 microns.

30. The method of claim 26 wherein the weaving step includes weaving electrically non-conductive fill strands in an off-machine direction and weaving electrically non-conductive warp strands in a machine direction.

31. The method of claim 30 wherein the weaving step further includes weaving uncrimped strands in the machine and/or off-machine directions.

32. The method of claim 26 wherein the weaving step includes weaving a plurality of layers of fabric together by an electrically conductive strand.

\* \* \* \* \*